(12) United States Patent
Oh

(10) Patent No.: US 9,041,850 B2
(45) Date of Patent: May 26, 2015

(54) CAMERA MODULE FOR TILT BALANCE OF LENS

(75) Inventor: Hyunah Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 155 days.

(21) Appl. No.: 13/808,215

(22) PCT Filed: Jun. 22, 2011

(86) PCT No.: PCT/KR2011/004543
§ 371 (c)(1),
(2), (4) Date: Jan. 3, 2013

(87) PCT Pub. No.: WO2012/005456
PCT Pub. Date: Jan. 12, 2012

(65) Prior Publication Data
US 2013/0100343 A1    Apr. 25, 2013

(30) Foreign Application Priority Data
Jul. 6, 2010 (KR) .................. 10-2010-0064744

(51) Int. Cl.
*H04N 5/225* (2006.01)
*G03B 17/12* (2006.01)
*H01L 27/146* (2006.01)
*H01L 21/00* (2006.01)

(52) U.S. Cl.
CPC .............. *H04N 5/2253* (2013.01); *G03B 17/12* (2013.01); *H01L 27/14618* (2013.01); *H01L 27/14625* (2013.01); *H04N 5/2254* (2013.01); *H04N 5/2257* (2013.01)

(58) Field of Classification Search
CPC . H04N 5/2253; H04N 5/2254; H04N 5/2257; H01L 27/14625; H01L 27/14627

USPC ................. 348/340, 373–374; 438/60, 64–75
See application file for complete search history.

(56) References Cited

U.S. PATENT DOCUMENTS

| 2006/0197862 | A1 | 9/2006 | Lung |
| 2007/0152147 | A1 | 7/2007 | Webster |
| 2007/0200944 | A1* | 8/2007 | Takeuchi et al. ............... 348/294 |
| 2008/0131112 | A1* | 6/2008 | Aoki et al. .................... 396/429 |
| 2010/0053388 | A1* | 3/2010 | Kobayashi et al. ........... 348/294 |
| 2010/0149410 | A1* | 6/2010 | Matsuzawa .................... 348/374 |
| 2012/0104536 | A1* | 5/2012 | Seo et al. ....................... 257/459 |

FOREIGN PATENT DOCUMENTS

KR    10-2009-0110978 A    10/2009

* cited by examiner

*Primary Examiner* — Kelly L Jerabek
(74) *Attorney, Agent, or Firm* — Birch, Stewart, Kolasch & Birch, LLP

(57) ABSTRACT

The present invention relates to a camera module including: a lens unit mounted with at least one or more lenses; an image sensor mounted with an image pickup device for converting a light converged through the lenses to an electric signal; a PCB (Printed Circuit Board) mounted with the image sensor; and a holder accommodated inside the lens unit for supporting the lens unit, wherein the lens unit is bonded and fixed at an inner surface of the holder, whereby the lens unit mounted with a plurality of lenses is bonded to a lateral surface of a holder to prevent generation of vertical tilting phenomenon at the lens unit caused by a conventional improper coating of epoxy, and particularly, the coating of epoxy on the lateral surface of the holder advantageously enhances adhesive power to increase a bonded area.

10 Claims, 2 Drawing Sheets

PRIOR ART

CAMERA MODULE FOR TILT BALANCE OF LENS

TECHNICAL FIELD

The teachings in accordance with the exemplary embodiments of this invention relate generally to a camera module.

BACKGROUND ART

Recently, demands on a small-sized compact camera module are on the increase for use in various multimedia fields including notebook type personal computers, camera phones, PDAs (Personal Digital Assistants), Smartphones and toys, and further in image input equipment including monitoring cameras and information terminals for video tape recorders.

Particularly, designs are elements that have a great influence on sales of mobile phones, whereby small-sized camera modules are greatly demanded.

The camera module is manufactured employing an image sensor or a photoelectric conversion device such as a CCD (Charge Coupled Apparatus) type or a CMOS (Complementary Metal Oxide Semiconductor) type to converge light from an object to a photosensitive element and to form an image of the object. That is, light of the object is concentrated by image sensor chips through a lens, an optical signal of the light is converted to an electric signal, and the image is transmitted to allow the object to be displayed on a display medium such as an LCD (Liquid Crystal Display) display device.

The camera module generally includes a plurality of lenses, and a driving source is mounted to each lens to move the lens and to change a relative distance thereof, whereby an optical focal length is adjusted.

FIG. 4 is a camera module according to prior art, which will be described briefly.

Referring to FIG. 4, an image sensor (2) is mounted on a printed circuit board (1, PCB), and a lens unit (3) disposed with a plurality of lenses is positioned at an upper surface of the image sensor (2) on a light irradiation path. Furthermore, a holder (4) for supporting the lens unit (3) and guiding positions is mounted.

The lens unit (3) in the conventional camera module is mounted at an upper periphery of the PCB (1) by an adhesive for the light to be irradiated to the image sensor (2) through the plurality of lenses. At this time, the adhesive is bonded, on the drawing, to a bottom surface of the lens unit (3) or to the upper periphery of the PCB (1) to allow the lens unit (3) to be bonded, where the following problems occur as conventional epoxy is coated as an adhesive to allow the lens unit (3) to be bonded.

In case the epoxy is coated for bonding, the coating must be conducted to form a relatively even surface, and if the relatively even surface is not formed, a vertical tilt is generated on the lens unit (3) to affect a resolution, whereby a physical influence is affected on the image sensor (2) nearby the PCB (1) to resultantly affect the resolution.

Furthermore, another problem is that adhesive power becomes weak due to narrowness of coated surface of epoxy, that is, narrowness of bonded surface, to decrease performance of the image sensor (2) as a result of heat or gas generated in the course of curing of the epoxy. Still another problem is that ghost phenomenon occurs due to the gas.

DISCLOSURE OF INVENTION

Technical Problem

The present invention is directed to solve the aforementioned problems or disadvantages by bonding a lens unit mounted with a plurality of lenses to a lateral surface of a holder, instead of bonding and fixing the lens unit mounted with a plurality of lenses to a PCB (Printed Circuit Board).

Particularly, the present invention is to provide an easily-manufacturable camera module in which a holder includes two bodies for bonding a lens unit to a lateral surface of the holder, where the lens unit is bonded to a first body, and a second body is mounted at the first body.

Technical problems to be solved by the present invention are not restricted to the above-mentioned, and any other technical problems not mentioned so far will be clearly appreciated from the following description by skilled in the art.

Solution to Problem

An object of the invention is to solve at least one or more of the above problems and/or disadvantages in whole or in part and to provide at least the advantages described hereinafter. In order to achieve at least the above objects, in whole or in part, and in accordance with the purposes of the invention, as embodied and broadly described, and in one general aspect of the present invention, there is provided a camera module, the camera module comprising: a lens unit mounted with at least one or more lenses; an image sensor mounted with an image pickup device for converting a light converged through the lenses to an electric signal; a PCB (Printed Circuit Board) mounted with the image sensor; and a holder accommodated inside the lens unit for supporting the lens unit, wherein the lens unit is bonded and fixed at an inner surface of the holder.

Preferably, the holder includes a first body and a second body, and the lens unit is bonded and fixed at an inner surface of the second body, and the first body is bonded and fixed to an upper surface of the second body.

Preferably, a surface contacted by the first body and the second body is formed with at least one or more exhaust grooves for discharging gas and heat generated in the course of curing adhesive for fixing the first body.

Preferably, each of the first and second bodies takes the shape of a square, and at least one or more exhaust grooves is formed on each side of the square.

Advantageous Effects of Invention

The camera module according to the present invention has an advantageous effect in that a lens unit mounted with a plurality of lenses is bonded to a lateral surface of a holder to prevent generation of vertical tilting phenomenon at the lens unit caused by a conventional improper coating of epoxy. Particularly, the coating of epoxy on the lateral surface of the holder advantageously enhances adhesive power to increase a bonded area.

The camera module according to the present invention has another advantageous effect in that a holder includes two bodies for bonding a lens unit to a lateral surface of the holder, where the lens unit is bonded to a first body, and a second body is mounted at the first body, whereby the camera module can be easily manufactured, and where a groove is formed between the first body and the second body to discharge heat and gas generated in the course of curing an epoxy to restrain generation of decreased resolution and ghost phenomenon.

BRIEF DESCRIPTION OF DRAWINGS

The teachings of the present invention can be readily understood by considering the following detailed description in conjunction with the accompanying drawings, in which.

BEST MODE FOR CARRYING OUT THE INVENTION

Figure 1:
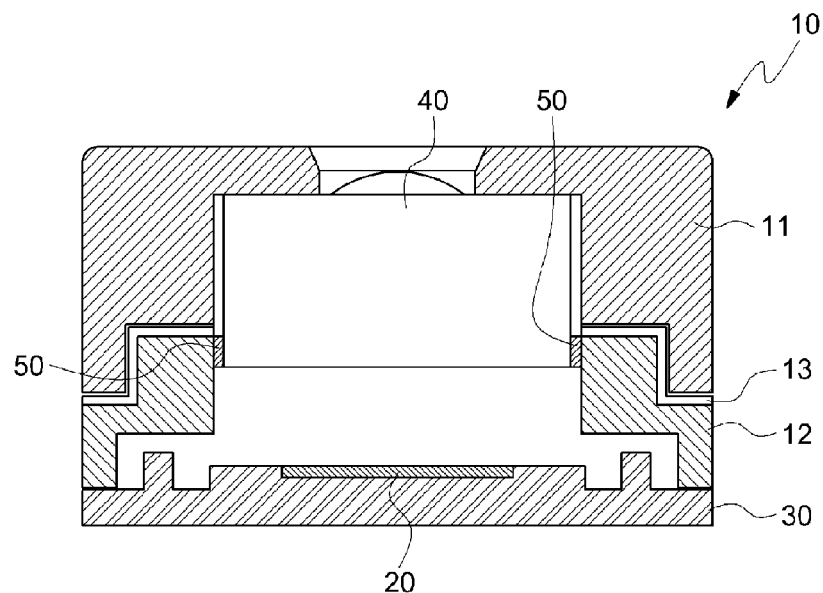
FIG. 1 is a schematic view of a camera module according to an exemplary embodiment of the present invention.

The following description is not intended to limit the invention to the form disclosed herein. Consequently, variations and modifications commensurate with the following teachings, and skill and knowledge of the relevant art are within the scope of the present invention. The embodiments described herein are further intended to explain modes known of practicing the invention and to enable others skilled in the art to utilize the invention in such, or other embodiments and with various modifications required by the particular application (s) or use(s) of the present invention.

The disclosed embodiments and advantages thereof are best understood by referring to FIGS. 1-4 of the drawings, like numerals being used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments, and protected by the accompanying drawings. Further, the illustrated figures are only exemplary and not intended to assert or imply any limitation with regard to the environment, architecture, or process in which different embodiments may be implemented. Accordingly, the described aspect is intended to embrace all such alterations, modifications, and variations that fall within the scope and novel idea of the present invention.

It will be understood that the terms "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. That is, the terms "including", "includes", "having", "has", "with", or variants thereof are used in the detailed description and/or the claims to denote non-exhaustive inclusion in a manner similar to the term "comprising".

Furthermore, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated. That is, in the drawings, the size and relative sizes of layers, regions and/or other elements may be exaggerated or reduced for clarity. Like numbers refer to like elements throughout and explanations that duplicate one another will be omitted. Now, the present invention will be described in detail with reference to the accompanying drawings.

Words such as "thereafter," "then," "next," etc. are not intended to limit the order of the processes; these words are simply used to guide the reader through the description of the methods.

It will be understood that when an element is referred to as being "connected" or "coupled" to another element, it can be directly connected or coupled to the other elements or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise.

Figure 2:
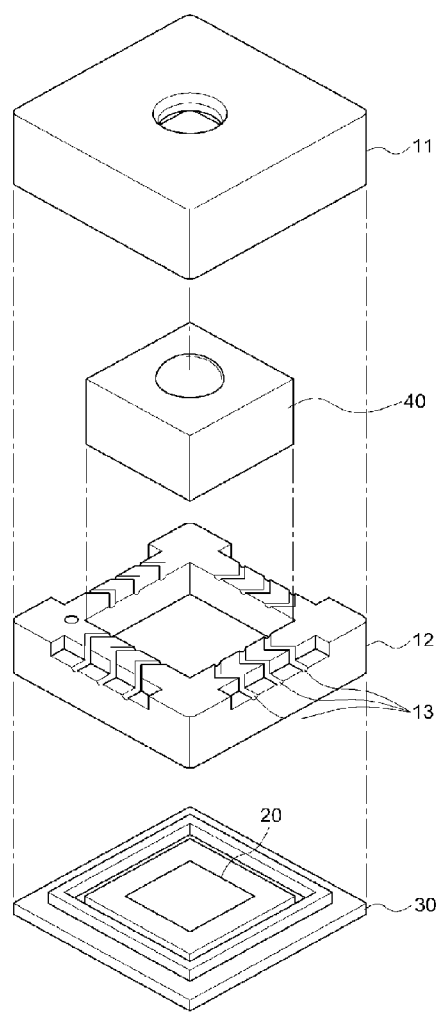
FIG. 2 is an exploded perspective view of a camera module of FIG. 1.
Figure 3:
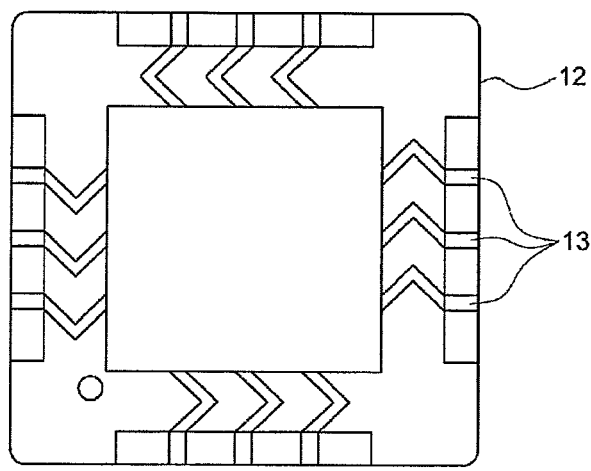
FIG. 3 is a schematic view of a second body in a holder illustrated in FIGS. 1 and 2.

FIG. 1 is a schematic view of a camera module according to an exemplary embodiment of the present invention, FIG. 2 is an exploded perspective view of a camera module of FIG. 1, and FIG. 3 is a schematic view of a second body in a holder illustrated in FIGS. 1 and 2.

Figure 4:
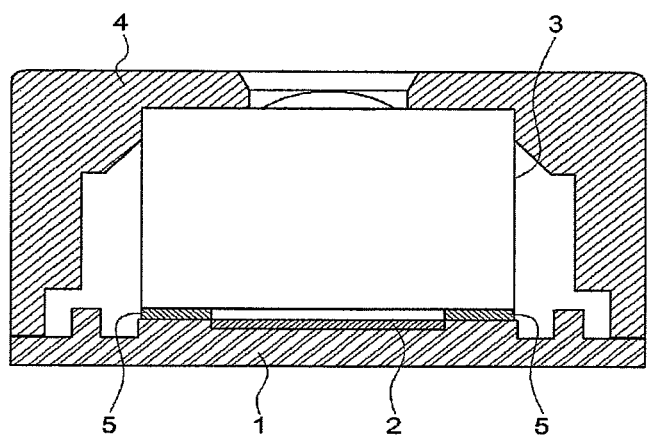
FIG. 4 is a schematic view of a camera module according to prior art.

An external difference between a conventional camera module illustrated in FIG. 4 and a camera module according to an exemplary embodiment of the present invention is that a holder (10) is vertically divided into a first body (12) and a second body (11) to divide the holder (10) on the drawings. A lens unit (40) formed with a plurality of lenses is fixed by an adhesive (50) including an epoxy to a lateral surface of the first body (12) of the holder on the drawings. Although a lion's share of the lens unit (40) is accommodated in the second body (11) in the drawings, it should be apparent that the lens unit (40) may be fixed by an adhesive (50) including an epoxy to a lateral surface of the first body (12) nearer to an image sensor (20) according to change in optical design.

The camera module according to the present invention has an advantage in that an adhesive power is increased by fixing the lens unit (40) formed with a plurality of lenses using the adhesive (50) including an epoxy to a lateral surface of the first body (12) of the holder, to enhance a bonded area over the conventional method where a lens unit is bonded to a PCB. Furthermore, the disadvantage of generating a change in resolution caused by a vertical incline difference can be avoided by bonding/fixing the lens unit (40) formed with a plurality of lenses using the adhesive (50) including an epoxy to a lateral surface of the holder, when the lens unit is bonded to the PCB to form an uneven surface of coated adhesive.

MODE FOR THE INVENTION

As noted above, the first body (12) of the holder (10) is adhesively fixed by the lens unit (40), and an upper surface of the first body (12) is fixed by the second body (11) using an adhesive as shown in FIGS. 1 and 2. At this time, the upper surface of the first body (12) is formed at an upper surface of the first body (12) with a plurality of exhaust grooves (13), and as depicted in FIGS. 2 and 3, the holder (10) takes the shape of a square, where each side of the square is formed with a group of exhaust grooves (13).

As a result, heat and gas generated during curing of the adhesive can be discharged to outside to restrict decreased resolution and generation of ghost phenomenon. Preferably, three exhaust grooves (13) are formed on at each side of the square holder, where the central groove serves to discharge heat and gas while two grooves at both sides functions to prevent the adhesive from overflowing whereby the second body (11) can be secured.

As illustrated in FIG. 3, the exhaust grooves may take the shape of a wavy curvature to improve discharge of the heat and gas, but the shape of the exhaust groove is not limited thereto.

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

INDUSTRIAL APPLICABILITY

The present invention has an industrial applicability in that a camera module can be applied to various multimedia fields including notebook type personal computers, camera phones, PDAs (Personal Digital Assistants), Smartphones and toys, where a lens unit mounted with a plurality of lenses is bonded to a lateral surface of a holder to prevent generation of vertical tilting phenomenon at the lens unit caused by a conventional improper coating of epoxy. Particularly, the coating of epoxy on the lateral surface of the holder advantageously enhances adhesive power to increase a bonded area.

The invention claimed is:

1. A camera module, the camera module comprising:
a lens unit mounted with at least one or more lenses;
an image sensor mounted with an image pickup device for converting a light converged through the lenses to an electric signal;
a PCB (Printed Circuit Board) mounted with the image sensor; and
a holder accommodated outside the lens unit for supporting the lens unit, wherein the lens unit is bonded and fixed at a lateral surface thereof to an inner surface of the holder,
wherein the holder includes a first body and a second body, said inner surface of the holder is an inner surface of the second body, and the first body is bonded and fixed to an upper portion of the second body, and
wherein a surface of the first or second body contacted by the other of the first or second body is formed with at least one or more exhaust grooves.

2. The camera module of claim 1, wherein each of the first and second bodies takes the shape of a square, and at least one or more exhaust grooves is formed on each side of the square.

3. The camera module of claim 1, wherein at least one or more of the exhaust grooves contribute to discharge gas and heat generated in the course of curing adhesive for fixing the first body.

4. A camera module, the camera module comprising:
a lens unit mounted with a plurality of lenses;
an image sensor mounted with an image pickup device for converting a light converged through the lenses to an electric signal;
a PCB (Printed Circuit Board) mounted with the image sensor; and
a holder accommodated outside the lens unit for supporting the lens unit, wherein the lens unit bonds and fixes an inner surface of the holder to a part of a lateral surface facing the inner surface of the holder,
wherein the holder includes a first body and a second body, said inner surface of the holder is an inner surface of the second body,
wherein the first body is bonded and fixed to an upper portion of the second body, and
wherein a surface of the first or second body contacted by the other of the first or second body is formed with at least one or more exhaust grooves.

5. The camera module of claim 4, wherein at least one or more exhaust grooves is provided at the surface of the first or second body.

6. The camera module of claim 5, wherein at least three exhaust grooves are formed at one lateral surface, each arranged at an equi-distance.

7. The camera module of claim 6, wherein each of the exhaust grooves is symmetrically arranged formed at mutually facing surface.

8. The camera module of claim 5, wherein the exhaust groove is changed in its direction at least more than once.

9. The camera module of claim 8, wherein each of the first and second bodies takes the shape of a square.

10. The camera module of claim 4, wherein at least one or more of the exhaust grooves contribute to discharge gas and heat generated in the course of curing adhesive for fixing the first body.

* * * * *